(12) United States Patent
Kikuchi

(10) Patent No.: US 12,736,582 B2
(45) Date of Patent: Sep. 15, 2026

(54) DEVICE HANDLING APPARATUS AND DEVICE TESTING APPARATUS

(71) Applicant: ADVANTEST Corporation, Tokyo (JP)

(72) Inventor: Aritomo Kikuchi, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 140 days.

(21) Appl. No.: 18/963,384

(22) Filed: Nov. 27, 2024

(65) Prior Publication Data

US 2025/0172610 A1 May 29, 2025

(30) Foreign Application Priority Data

Nov. 28, 2023 (JP) ................................ 2023-201111

(51) Int. Cl.
*G01R 31/28* (2006.01)
*G01R 1/04* (2006.01)

(52) U.S. Cl.
CPC ....... *G01R 31/2893* (2013.01); *G01R 1/0466* (2013.01); *G01R 31/2887* (2013.01)

(58) Field of Classification Search
CPC ............ G01R 31/2893; G01R 31/2851; G01R 31/2886; G01R 31/311; G01R 31/2887; G01R 1/067; G01R 1/06794; G01R 1/07307; H01R 31/06; H01R 13/665; G02F 1/133616; G02F 1/133606; G02F 1/133512; G02F 1/133504; B25J 11/008; B25J 11/00; B25J 15/0616; B25J 19/021; B25J 5/06; B25J 9/1656; B25J 15/00; B25J 19/005; B25J 5/04; B25J 9/0093
See application file for complete search history.

(56) References Cited

U.S. PATENT DOCUMENTS 5,432,878 A 7/1995 Smous
6,389,688 B1 * 5/2002 Srivastava ......... H05K 13/0812 29/740

(Continued)

FOREIGN PATENT DOCUMENTS

JP H08-105937 A 4/1996
JP 2011-226806 A 11/2011

(Continued)

OTHER PUBLICATIONS

Office Action issued in counterpart Taiwanese Patent Application No. 113145759 mailed Mar. 19, 2026 (17 pages).

(Continued)

*Primary Examiner* — Vinh P Nguyen
(74) *Attorney, Agent, or Firm* — Osha Bergman Watanabe & Burton LLP

(57) ABSTRACT

A device handling apparatus that handles a device under test (DUT), the DUT including a main body portion including a die, an optical fiber having one end connected to the main body portion, and a connector connected to the other end of the optical fiber, the device handling apparatus includes a holding head that holds the DUT while the optical fiber is separated from the holding head and a moving device that moves the holding head. The holding head includes a first holding portion that holds the main body portion and a second holding portion that holds the connector.

9 Claims, 6 Drawing Sheets

(56) References Cited

U.S. PATENT DOCUMENTS

| | | | | |
|---|---|---|---|---|
| 7,471,819 | B2 | 12/2008 | Ichikawa et al. | |
| 9,588,142 | B2 * | 3/2017 | Kiyokawa | G01R 1/06794 |
| 11,496,227 | B2 * | 11/2022 | Shiota | H04B 17/0085 |
| 11,557,875 | B2 | 1/2023 | Kovsh et al. | |
| 2011/0254945 | A1 | 10/2011 | Kikuchi et al. | |
| 2015/0016817 | A1 | 1/2015 | Hara et al. | |
| 2020/0371158 | A1 | 11/2020 | Kato et al. | |
| 2022/0034963 | A1 | 2/2022 | Keck et al. | |
| 2022/0035110 | A1 | 2/2022 | Keck et al. | |
| 2022/0196732 | A1 | 6/2022 | Coons et al. | |
| 2022/0350095 | A1 | 11/2022 | Keck et al. | |
| 2023/0018654 | A1 | 1/2023 | Winzer et al. | |

FOREIGN PATENT DOCUMENTS

| | | | |
|---|---|---|---|
| JP | 2020-190520 | A | 11/2020 |
| TW | 202204916 | A | 2/2022 |
| TW | 202225072 | A | 7/2022 |
| WO | 2023099456 | A1 | 6/2023 |

OTHER PUBLICATIONS

Office Action issued in corresponding Taiwanese Application No. 113145759, dated Jul. 3, 2025 (11 pages).

Rojas, "Do you know the PoE standards and parameters", OPTCORE, May 10, 2021, Source: https://www.optcore.net/article005/ (8 pages).

* cited by examiner

FIG. 1A
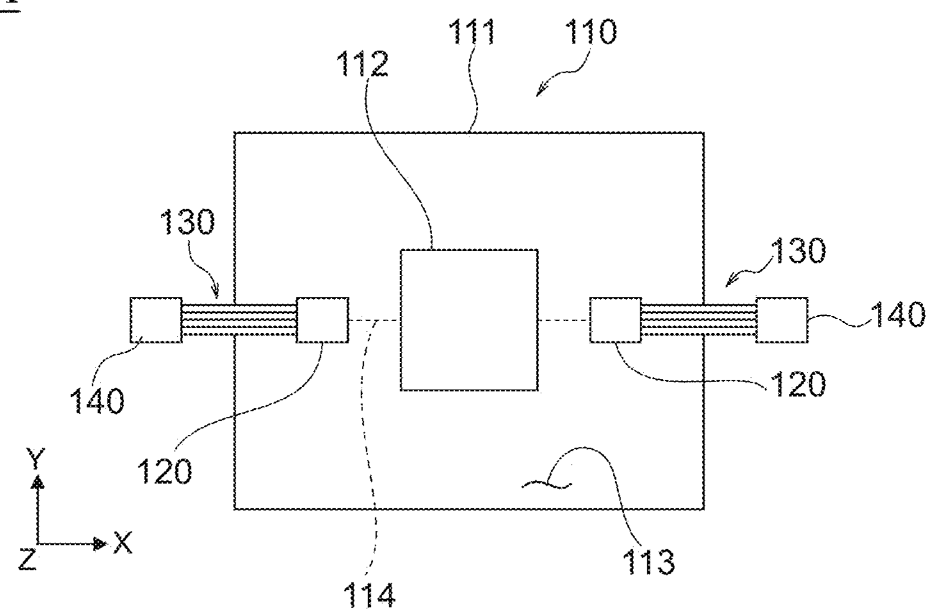
FIG. 1B
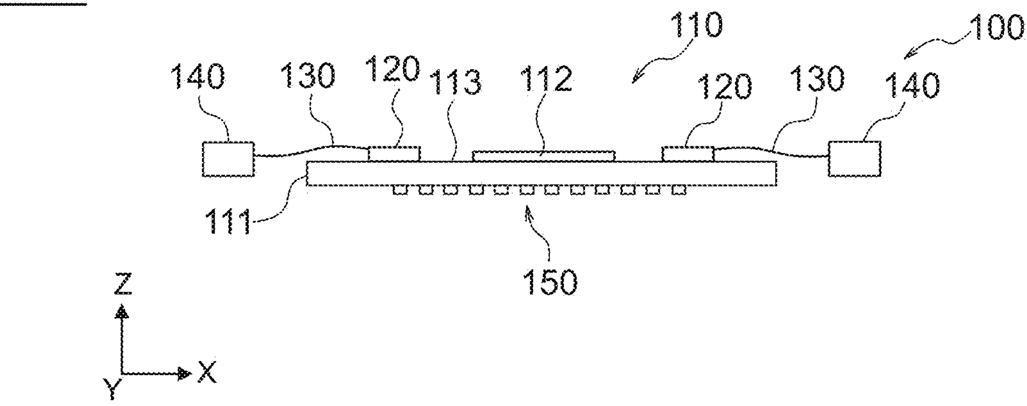

DEVICE HANDLING APPARATUS AND DEVICE TESTING APPARATUS

CROSS-REFERENCE TO RELATED APPLICATIONS

The present application claims priority to Japanese Patent Application No. 2023-201111, filed Nov. 28, 2023. The contents of this application are incorporated herein by reference in their entirety.

BACKGROUND

Technical Field

The present invention relates to a device handling apparatus that handles a device under test (DUT) including an optical fiber in order to test the DUT and a device testing apparatus that tests the above-described DUT.

Description of the Related Art

There has been known an electronic component handling apparatus that conveys an electronic component while holding it with an arm provided with a suction mechanism and presses it against a socket of a test head (for example, see Patent Document 1).

PATENT DOCUMENT

Patent Document 1: JP 2020-190520 A

Some devices to be tested include a main body portion including a die and a substrate, an optical fiber having one end connected to the main body portion, and a connector connected to the other end of the optical fiber. When such a device is to be conveyed by the above-described electronic component handling apparatus, only the main body portion is held and the optical fiber and the connector of the device are not held. In view of this, the above-described electronic component handling apparatus cannot hold and convey a device including an optical fiber.

SUMMARY

One or more embodiments provide a device handling apparatus that can convey a device including an optical fiber.

Aspect 1 of one or more embodiments is a device handling apparatus that handles a DUT. The DUT includes a main body portion including a die, an optical fiber having one end connected to the main body portion, and a first connector connected to another end of the optical fiber. The device handling apparatus includes: a holding head that holds the DUT; and a first moving device that moves the holding head. The holding head includes: a first holding portion that holds the main body portion; and a second holding portion that holds the first connector. The holding head holds the DUT with the optical fiber separated from the holding head.

In Aspect 2 of one or more embodiments, which is the device handling apparatus of Aspect 1, the first holding portion may include a first suction pad that suctions and holds the main body portion. The second holding portion may include a second suction pad that suctions and holds the first connector.

In Aspect 3 of one or more embodiments, which is the device handling apparatus of Aspect 1, the first holding portion may include a first gripper that grips the main body portion. The second holding portion may include a second gripper that grips the first connector.

In Aspect 4 of one or more embodiments, which is the device handling apparatus of any of Aspects 1 to 3, the first moving device may press the DUT against a socket with the holding head opposed to the DUT to electrically connect a terminal included in the main body portion to a contactor of the socket. The holding head may include a first contact portion that comes in contact with the main body portion when the DUT is pressed against the socket.

In Aspect 5 of one or more embodiments, which is the device handling apparatus of Aspect 4, the main body portion of the DUT may include: a wiring board to which the optical fiber is connected; and the die mounted on the wiring board. The first contact portion may come in contact with the wiring board when the DUT is pressed against the socket.

In Aspect 6 of one or more embodiments, which is the device handling apparatus of Aspect 5, the wiring board may include a connecting portion to which the optical fiber is connected on a principal surface of the wiring board. The first contact portion may come in contact with a region other than the connecting portion on the principal surface when the DUT is pressed against the socket.

In Aspect 7 of one or more embodiments, which is the device handling apparatus of Aspect 5 or 6, the wiring board may include a connecting portion to which the optical fiber is connected. The first contact portion may include a depressed portion opposed to the connecting portion when the DUT is pressed against the socket.

Aspect 8 of one or more embodiments is a device testing apparatus that tests a DUT. The DUT includes a main body portion including a die, an optical fiber having one end connected to the main body portion, and a first connector connected to another end of the optical fiber. The device testing apparatus includes: the device handling apparatus of any one of Aspects 1 to 7; a socket electrically connected to the main body portion of the DUT; a second connector optically connected to the first connector; and a tester that tests the DUT via the socket and the second connector.

Aspect 9 of one or more embodiments, which is the device testing apparatus of Aspect 8, may include a second moving device that moves the second connector in a first direction substantially parallel to a principal surface of the main body portion. The socket may include a second contact portion that comes in contact with the first connector in the first direction.

In one or more embodiments, the holding head of the device handling apparatus includes the first holding portion that holds the main body portion of the DUT and the second holding portion that holds the first connector connected to the optical fiber, which allows both of the main body portion and the first connector to be held. Therefore, the device including the optical fiber can be conveyed. Moreover, in one or more embodiments, because the holding head holds the device with the optical fiber separated from the holding head, damage to the optical fiber during conveyance can be suppressed.

BRIEF DESCRIPTION OF THE DRAWINGS

FIG. 1A is a plan view illustrating a configuration of a DUT according to one or more embodiments;

FIG. 1B is a side view illustrating a configuration of a DUT according to one or more embodiments;

DESCRIPTION OF ONE OR MORE EMBODIMENTS

The following describes embodiments based on the drawings.

Figure 2:
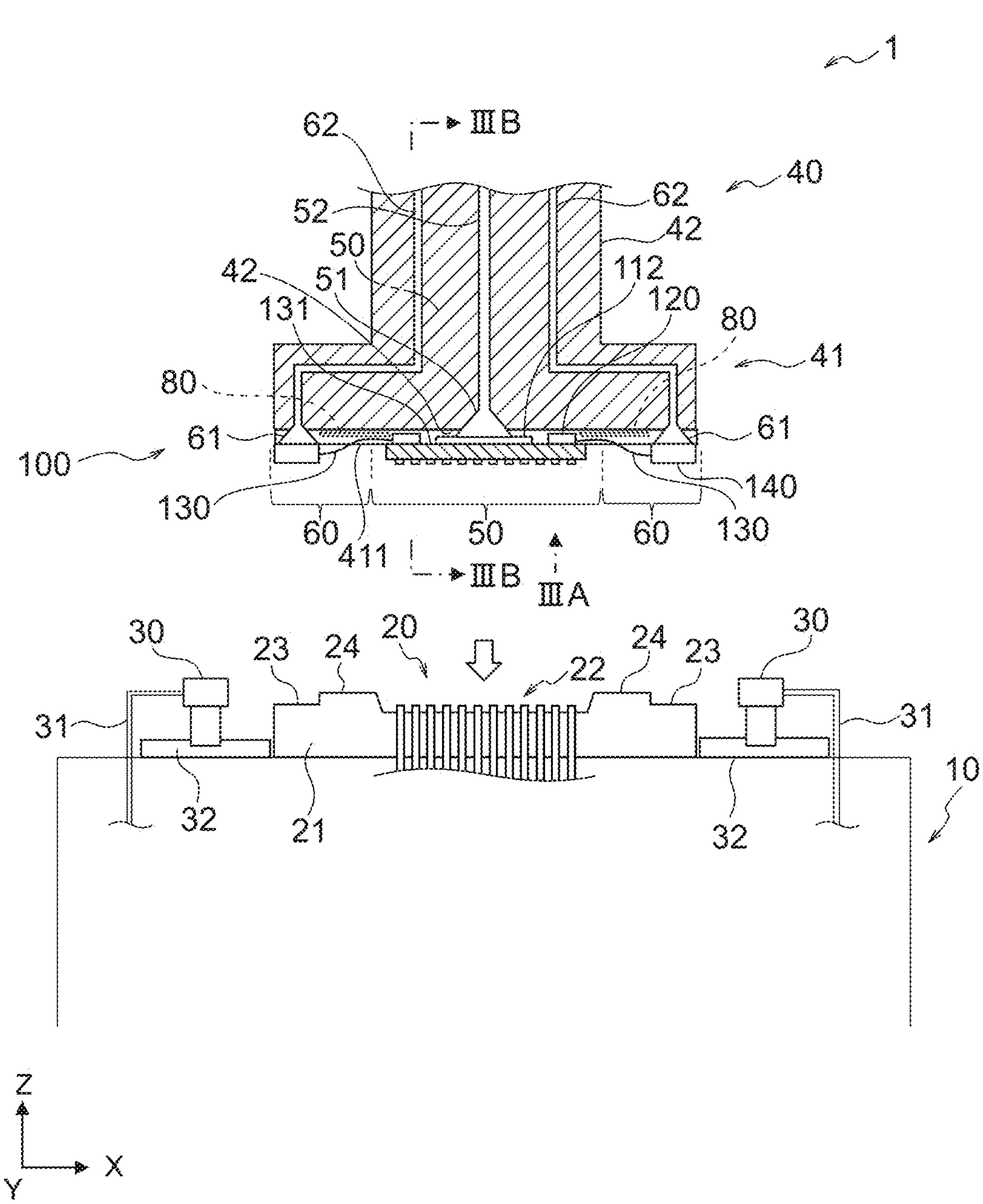
FIG. 2 is a cross-sectional view illustrating a configuration of a device testing apparatus according to one or more embodiments.
Figure 3A:
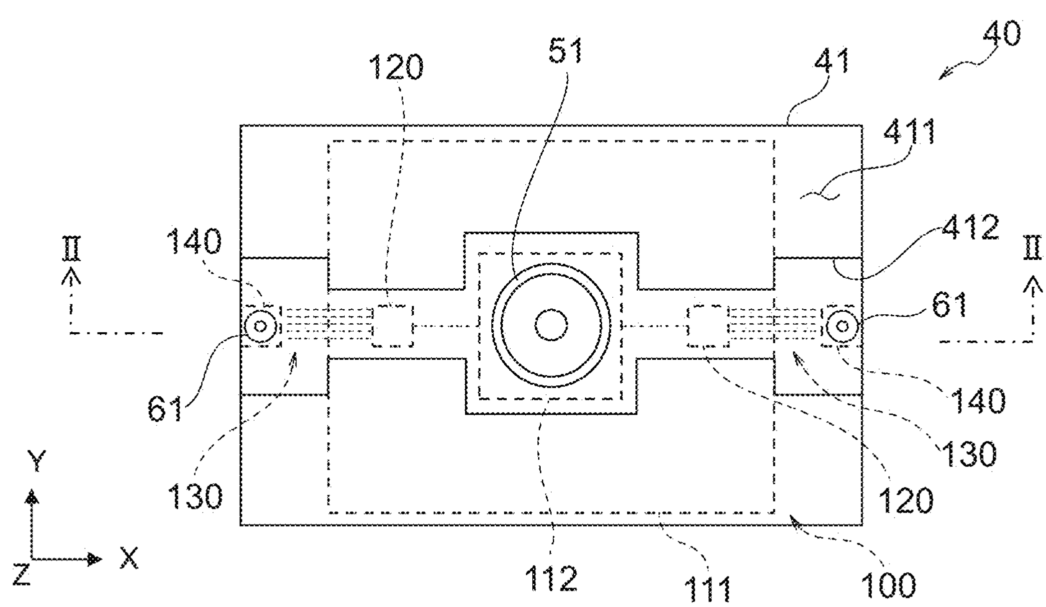
FIG. 3A is a bottom view of a holding head as viewed along the IIIA-direction of FIG. 2.
Figure 3B:
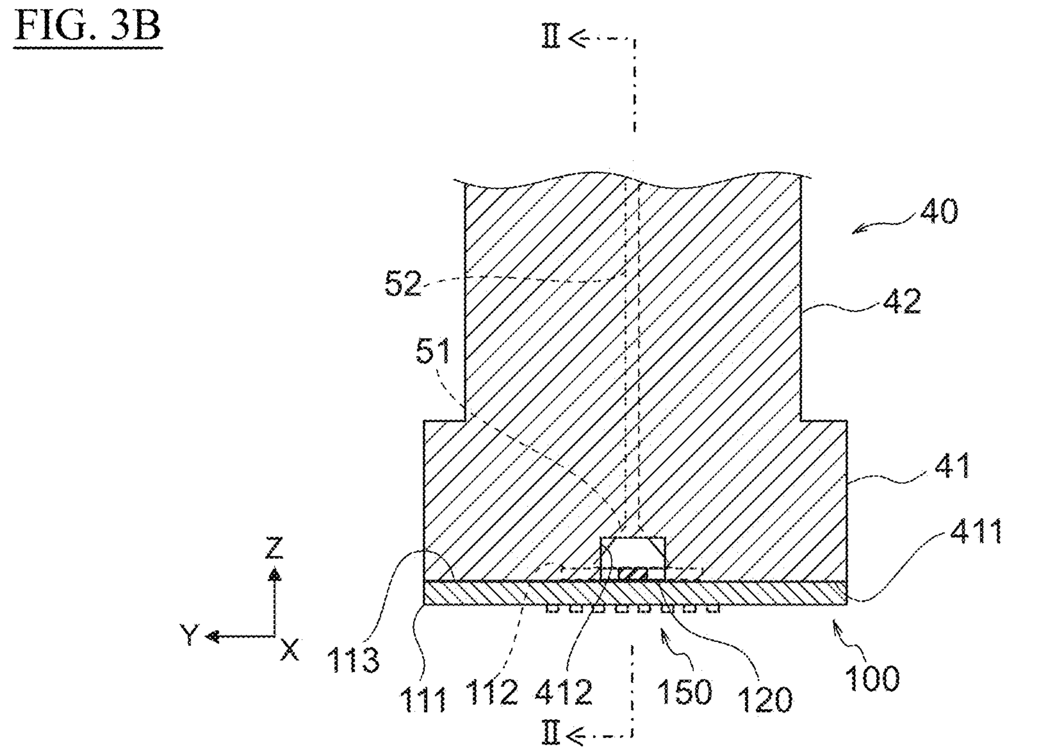
FIG. 3B is a cross-sectional view taken along the line IIIB-IIIB of FIG. 2.

FIG. 1A and FIG. 1B are a plan view and a side view illustrating a configuration of a DUT 100 according to one or more embodiments, FIG. 2 is a cross-sectional view illustrating a configuration of a device testing apparatus 1 according to one or more embodiments, FIG. 3A is a bottom view of a holding head 41 as viewed along the IIIA-direction of FIG. 2, and FIG. 3B is a cross-sectional view taken along the line IIIB-IIIB of FIG. 2. Note that FIG. 2 is a cross-sectional view taken along the line II-II of FIG. 3A, while also being a view taken along the line II-II of FIG. 3B.

The DUT 100, which is to be tested by the device testing apparatus 1 according to one or more embodiments, is a device (semiconductor device) that can handle an electric signal and an optical signal. Specifically, as illustrated in FIG. 1A and FIG. 1B, the DUT 100 is a device with a so-called pigtail, including a main body portion 110, optical modules 120, optical fibers 130, optical connectors 140, and an input/output terminal 150. The main body portion 110 includes a substrate 111 and a die 112. Specific examples of the substrate 111 include a wiring board, such as an interposer.

The die 112 is a bare die (bare chip) formed by dicing a semiconductor wafer, and is mounted on an upper surface 113 of the substrate 111. The die 112 is connected to the optical modules 120 mounted on the upper surface 113 of the substrate 111 via conductive paths 114 for transmitting an electric signal. Although not particularly limited, the conductive paths 114 may be formed on a surface of the substrate 111 or may be formed inside the substrate 111.

The optical module 120 includes a photoelectric conversion element, and can convert an optical signal into an electric signal or convert an electric signal into an optical signal. One end of the optical fiber 130 is connected to the optical module 120. The optical fiber 130 has flexibility. Therefore, in the optical fiber 130, a portion other than the connecting part with the optical module 120 is freely deformable, and is moveable relative to the substrate 111.

The optical connector 140 is connected to the other end of the optical fiber 130. The optical connector 140 is provided at a distance from the substrate 111 via the optical fiber 130. This allows the optical connector 140 to move relative to the substrate 111, following the optical fiber 130. As will be described later, during a test of the DUT 100, the optical connector 140 is connected to an optical connector 30 provided on a tester 10. Although not particularly limited, examples of the optical connector 140 can include an MPO connector. Although not particularly limited, the input/output terminal 150 is mounted on a surface of the substrate 111 opposite to the surface on which the die 112 is mounted.

The device testing apparatus 1 according to one or more embodiments is an apparatus that tests the DUT 100. As illustrated in FIG. 2, the device testing apparatus 1 includes the tester (testing apparatus main body) 10, a socket 20, the optical connectors 30, and a handler 40. The handler 40 corresponds to an exemplary "device handling apparatus" according to the aspect of one or more embodiments.

The tester 10 is a testing apparatus that tests the DUT 100 using an electric signal and an optical signal. As will be described later, the tester 10 inputs and outputs an optical signal to and from the DUT 100 via the optical connectors 30, and inputs and outputs an electric signal from and to the DUT 100 via the socket 20 to perform the test of the DUT 100, and evaluates the DUT 100 according to the test result. Although not particularly illustrated, the tester 10 includes a generation function (for example, a light source) for generating a test signal (an optical signal and an electric signal), and an evaluation function that evaluates an output signal (an optical signal and an electric signal) from the DUT 100.

The socket 20 is provided on the tester 10. The socket 20 includes a socket main body 21, a contactor 22, connector receiving portions 23, and connector contacting portions 24.

The contactor 22 is disposed in the socket main body 21 so as to correspond to the input/output terminal 150 of the DUT 100. Although not particularly limited, specific examples of the contactor 22 include a pogo pin, a vertical-type probe needle, a cantilever-type probe needle, an anisotropic conductive rubber sheet, a bump provided on a membrane, or a contactor manufactured using a MEMS technology. As will be described later, the DUT 100 is pressed against the socket 20 by the handler 40, and the input/output terminal 150 of the DUT 100 comes in contact with the contactor 22, thereby electrically connecting the DUT 100 to the socket 20. The socket 20 allows input and output between the DUT 100 and the tester 10.

The connector receiving portion 23 is a region on the socket main body 21 where the optical connector 140 of the DUT 100 is placed when the DUT 100 is pressed against the socket 20 by the handler 40. Although the configuration of the connector receiving portion 23 is not particularly limited, the connector receiving portion 23 has at least a planar shape such that the optical connector 140 can be placed. In one or more embodiments, the height position of the planar shape of the connector receiving portion 23 is adjusted such that the input/output terminal 150 of the DUT 100 can come in contact with the contactor 22 in a state where the optical connector 140 is placed on the connector receiving portion 23.

The connector contacting portion 24 is a portion on which the optical connector 140 placed on the connector receiving portion 23 abuts in the direction along the X-direction in the drawing. The connector contacting portion 24 is provided so as to protrude from the connector receiving portion 23 in the upward direction (Z-direction in the drawing). As will be described later, the optical connector 140 placed on the connector receiving portion 23 comes in contact with the optical connector 30 that has moved in the X-direction on a horizontal rail 32, thereby coming in contact with the connector contacting portion 24 in the X-direction. Since the socket 20 includes the connector contacting portion 24, the movement of the optical connector 140 in the X-direction is restricted by the connector contacting portion 24 when the optical connector 30 comes in contact with the optical connector 140. Therefore, the optical connector 30 can be more easily fitted with the optical connector 140.

The optical connectors 30 are provided on the tester 10. The optical connectors 30 are optically connected to the tester 10 by optical fibers 31. As will be described later, the optical connector 30 is fitted with the optical connector 140 of the DUT 100 placed on the socket 20. The DUT 100 is optically connected to the tester 10 by fitting the optical connector 30 provided on the tester 10 with the optical connector 140 of the DUT 100. The optical connector 30 can move on the horizontal rail 32 by an actuator (example of an additional moving device), such as an air cylinder, driven along the X-direction (the direction substantially parallel to the upper surface 113 of the substrate 111) in the drawing. This allows the optical connector 30 to be fitted with the optical connector 140 of the DUT 100 placed on the socket 20 in the X-direction in the drawing.

As illustrated in FIG. 2, the handler 40 includes the holding head 41 that holds the DUT 100 and a contact arm (example of a moving device) 42 that moves the holding head 41.

The holding head 41 is a block-shaped member attached to a distal end of the contact arm 42. The holding head 41 includes a first holding portion 50 that holds the main body portion 110 of the DUT 100 and second holding portions 60 that hold the optical connectors 140 of the DUT 100. A suction pad 51 is formed in the first holding portion 50, and the suction pad 51 is communicated with a suction pipe 52. Air is sucked through the suction pipe 52 by a vacuum pump (not illustrated), thereby allowing the suction pad 51 to hold the main body portion 110 of the DUT 100. A suction pad 61 is formed in the second holding portion 60, and the suction pad 61 is communicated with a suction pipe 62. Air is sucked through the suction pipe 62 by a vacuum pump (not illustrated), thereby allowing the suction pad 61 to hold the optical connector 140 of the DUT 100.

As illustrated in FIG. 3A and FIG. 3B, a lower surface 411 of the holding head 41 comes in contact with the upper surface 113 of the substrate 111 of the DUT 100 when the DUT 100 is held. On the lower surface 411 of the holding head 41, a depressed portion 412, which is opposed to the optical connectors 140, the optical modules 120, and the die 112 of the DUT 100, is formed. Since the depressed portion 412 is formed, the lower surface 411 of the holding head 41 comes in contact with a region on the upper surface 113 of the substrate 111 of the DUT 100 where the optical connectors 140, the optical modules 120, the optical fibers 130, and the die 112 are not mounted. This allows the entire surface of the DUT 100 to be pressed as evenly as possible by the holding head 41. The shape of the depressed portion 412 is not particularly limited as long as the lower surface 411 can come in contact with the region of the DUT 100 where the optical connectors 140, the optical modules 120, the optical fibers 130, and the die 112 are not mounted. In one or more embodiments, the lower surface 411 of the holding head 41 refers to a region where a lower surface of the first holding portion 50 and lower surfaces of the second holding portions 60 are combined.

In one or more embodiments, the first holding portion 50 holds the main body portion 110 of the DUT 100 while the second holding portions 60 hold the optical connectors 140 of the DUT 100, and therefore the holding head 41 holds the DUT 100 with the optical fibers 130 separated from the holding head 41. That is, as illustrated in FIG. 2, spaces 80 are formed between the lower surface 411 and the depressed portion 412 of the holding head 41, and the optical fibers 130. Thus, damage to the optical fiber 130 can be suppressed since the optical fiber 130 is not fixed during conveyance.

Although not particularly limited, the holding head 41 may include a temperature adjustment mechanism that adjusts the temperature of the DUT 100. The temperature adjustment mechanism includes, for example, a heating device, a cooling device, and a temperature sensor. Examples of the heating device include a ceramic heater, such as an aluminum nitride heater, a silicon nitride heater, and a PTC heater, a polyimide heater, and a cartridge heater. Examples of the cooling device include a cooling channel formed in the holding head 41 and supplied with a refrigerant from the outside. As the refrigerant, a liquid or a gas may be used. Specific examples of the liquid refrigerant include water and a fluorine-based inert liquid. Specific examples of the gaseous refrigerant include air and nitrogen. As the heating device and the cooling device, a Peltier element may be used. The temperature adjustment mechanism for the DUT 100 is preferred to be formed in the first holding portion 50, which corresponds to the die 112 in the holding head 41, since a temperature change is large at the die 112 of the DUT 100 and around the die 112 during the test of the DUT 100. However, the position of the temperature adjustment mechanism for the DUT 100 is not particularly limited to the first holding portion 50.

Figure 4:
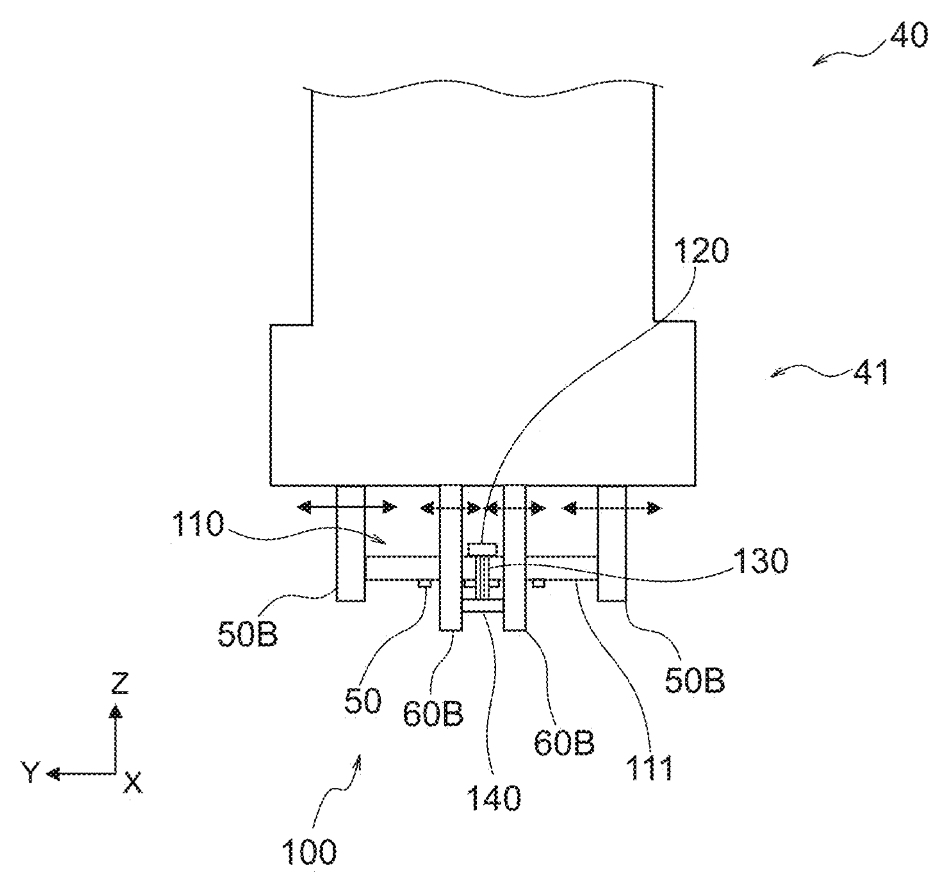
FIG. 4 is a side view of a device handling apparatus illustrating a modification of the holding head according to one or more embodiments.

In one or more embodiments, the first holding portion 50 of the holding head 41 includes the suction pad 51 and the second holding portion 60 includes the suction pad 61 to hold the DUT 100 by suction. However, the configuration of the holding head 41 is not particularly limited thereto as long as the DUT 100 can be held. For example, the first holding portion 50 may include a first gripper that grips (pinches) the substrate 111 of the DUT 100, and the second holding portion 60 may include a second gripper that grips the optical connector 140 of the DUT 100. Examples of the first and second grippers include a robot hand and the like. FIG. 4 illustrates an example of a first gripper 50B that grips the main body portion 110 of the DUT 100 and a second gripper 60B that grips the optical connector 140. FIG. 4 is a side view of the handler 40 illustrating a modification of the holding head 41 according to one or more embodiments.

The contact arm 42 is supported by a rail (not illustrated) provided on the handler 40. The contact arm 42 includes an actuator for horizontal movement (not illustrated) and can move back and forth and right and left along the rail. The contact arm 42 also includes an actuator for up-and-down driving (not illustrated) and can move up and down. The suction pipes 52 and 62 are formed inside the contact arm 42. The contact arm 42 moves the holding head 41, and thus the DUT 100 held by the holding head 41 is conveyed.

Figure 5:
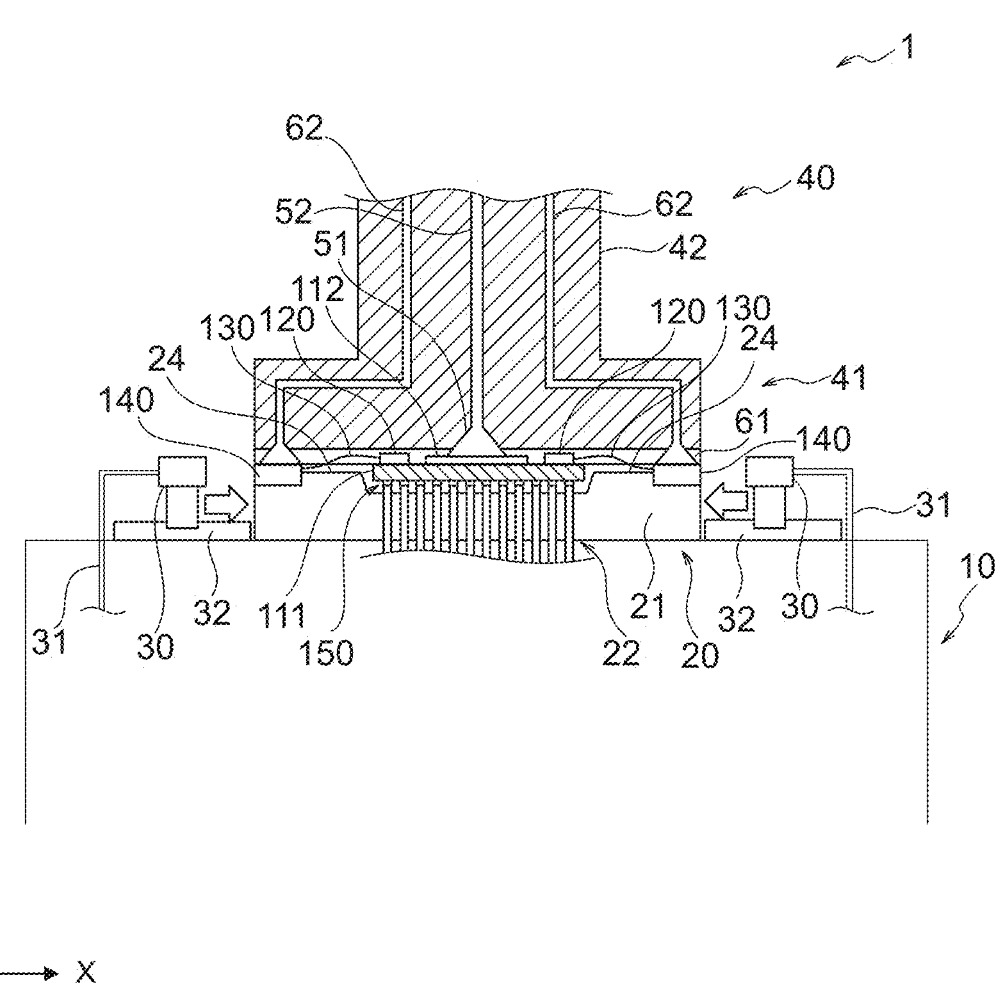
FIG. 5 is a cross-sectional view (Part 1) illustrating a method for pressing the DUT against a socket by a handler according to one or more embodiments.
Figure 6:
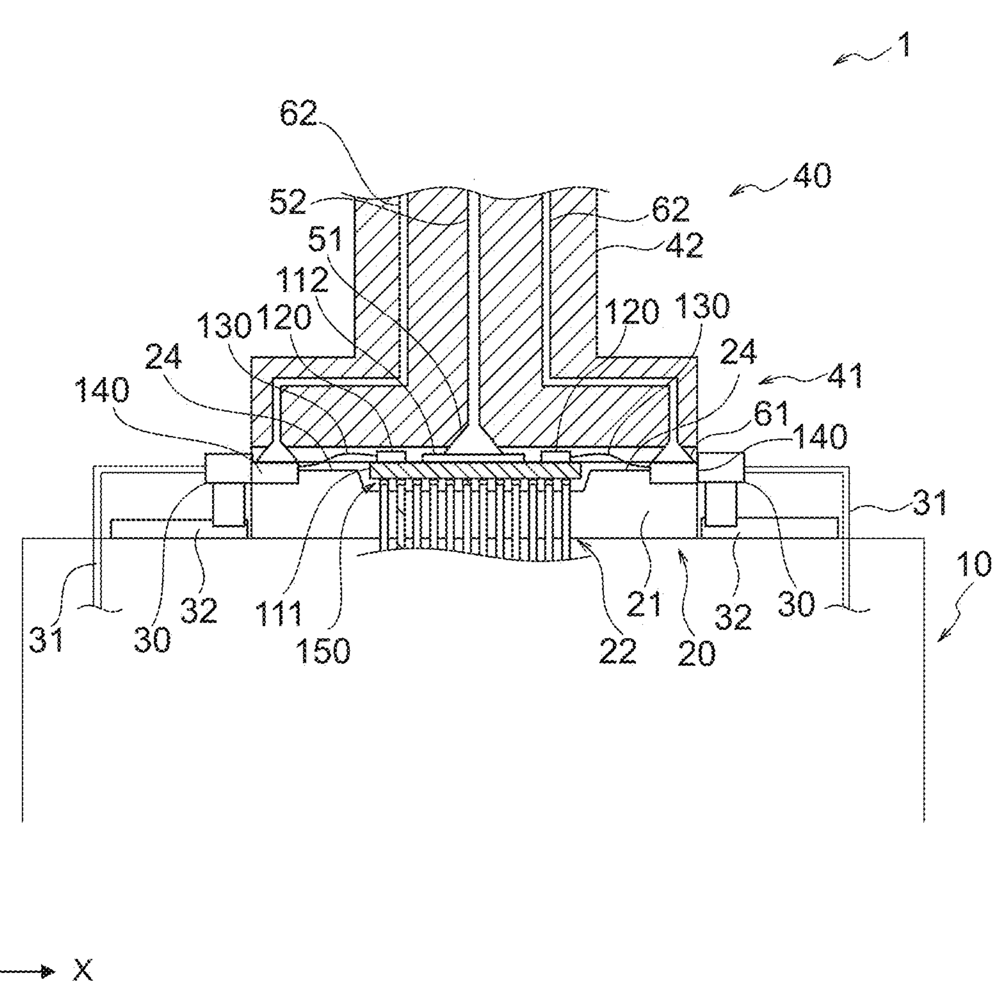
FIG. 6 is a cross-sectional view (Part 2) illustrating the method for pressing the DUT against the socket by the handler according to one or more embodiments.

The following describes a method for pressing the DUT 100 against the socket 20 by the handler 40 according to one or more embodiments, with reference to FIG. 2, FIG. 5, and FIG. 6. FIG. 5 and FIG. 6 are cross-sectional views illustrating the method for pressing the DUT 100 against the socket 20 by the handler 40 according to one or more embodiments.

First, the contact arm 42 is moved above the DUT 100 before the test placed on a tray or plate and then moved down, thereby causing the lower surface 411 of the holding head 41 to be in contact with the upper surface 113 of the substrate 111 of the DUT 100. At this time, the suction pad 51 of the first holding portion 50 of the holding head 41 comes in contact with the main body portion 110 of the DUT 100, and the suction pads 61 of the second holding portions 60 come in contact with the optical connectors 140 of the DUT 100.

Next, the main body portion 110 of the DUT 100 is sucked by the suction pad 51 and the optical connectors 140 of the DUT 100 are sucked by the suction pads 61, thereby holding the DUT 100 by the holding head 41, as illustrated in FIG. 2. Moving the contact arm 42 in this state allows the DUT 100 held by the holding head 41 to be conveyed. In one or more embodiments, the first holding portion 50 of the holding head 41 holds the main body portion 110 of the DUT 100, the second holding portions 60 hold the optical connectors 140 of the DUT 100, and the DUT 100 is held and conveyed with the optical fibers 130 separated from the holding head 41. Therefore, the damage to the optical fiber 130 during conveyance of the DUT 100 can be suppressed.

Next, the contact arm 42 is moved above the socket 20 and then moved down, thereby pressing the DUT 100 against the socket 20, as illustrated in FIG. 5. This causes the input/output terminal 150 of the DUT 100 to be in contact with the contactor 22 of the socket 20, and the DUT 100 is electrically connected to the tester 10 via the socket 20. At this time, since the depressed portion 412 is formed on the holding head 41, the lower surface 411 comes in contact with the region on the upper surface 113 of the substrate 111 where the optical connectors 140, the optical fibers 130, the optical modules 120, and the die 112 are not mounted. The optical connectors 140 of the DUT 100 are also placed on the connector receiving portions 23 of the socket 20.

Next, as illustrated in FIG. 6, the optical connector 30 is moved on the horizontal rail 32 by the actuator and fitted with the optical connector 140 of the DUT 100. At this time, in one or more embodiments, the optical connector 140 comes in contact with the connector contacting portion 24 of the socket 20, thereby restricting the movement of the optical connector 140 in the X-direction. Therefore, the optical connector 30 can be more easily fitted with the optical connector 140. The DUT 100 is optically connected to the tester 10 by fitting the optical connector 30 with the optical connector 140. In this state, an optical signal is input and output between the tester 10 and the DUT 100 via the optical connectors 30, 140, and an electric signal is input and output between the tester 10 and the DUT 100 via the socket 20 and the input/output terminal 150, thereby performing the test of the DUT 100. At this time, the optical signal is converted into an electric signal in the optical module 120, and input to and output from the die 112.

As described above, the handler 40 according to one or more embodiments includes the first holding portion 50 that holds the main body portion 110 of the DUT 100 including the optical fiber 130 and the second holding portions 60 that hold the optical connectors 140 of the DUT 100. This allows not only the main body portion 110 of the DUT 100 but also the optical connectors 140 to be held, and thus the DUT 100 including the optical fibers 130 can be held and conveyed.

Moreover, with the handler 40 according to one or more embodiments, the main body portion 110 is held by the first holding portion 50 and the optical connectors 140 are held by the second holding portions 60, thereby limiting a movable range of the optical fibers 130 and allowing the DUT 100 to be conveyed with the optical fibers 130 separated from the holding head 41. This allows suppressing the damage to the optical fiber 130.

The handler 40 according to one or more embodiments holds the optical connectors 140 by the second holding portions 60, and therefore the optical connectors 140 can be placed at predetermined positions (connector receiving portions 23) of the socket 20 when the DUT 100 is pressed against the socket 20. This facilitates a connection between the optical connectors 140 and the optical connectors 30 provided on the tester 10.

The handler 40 according to one or more embodiments includes the depressed portion 412 formed on the lower surface 411 of the holding head 41. This causes the holding head 41 to be in contact with the region of the substrate 111 of the DUT 100 where the optical connectors 140, the optical modules 120, the optical fibers 130, and the die 112 are not mounted, allowing the entire surface of the DUT 100 to be pressed as evenly as possible by the holding head 41. Therefore, the DUT 100 can be appropriately pressed against the socket 20, allowing the input/output terminal 150 of the DUT 100 to be in contact with the contactor 22 of the socket 20 more accurately.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 . . . Device testing apparatus
10 . . . Tester
20 . . . Socket
21 . . . Socket main body
22 . . . Contactor
23 . . . Connector receiving portion
24 . . . Connector contacting portion (additional contact portion)
30 . . . Optical connector (additional connector)
31 . . . Optical fiber
32 . . . Horizontal rail
40 . . . Handler (device handling apparatus)
41 . . . Holding head
411 . . . Lower surface (contact portion)
50 . . . First holding portion
51 . . . Suction pad (first suction pad)
52 . . . Suction pipe
60 . . . Second holding portion
61 . . . Suction pad (second suction pad)
62 . . . Suction pipe
42 . . . Contact arm
100 . . . DUT
110 . . . Main body portion
111 . . . Substrate
112 . . . Die
113 . . . Upper surface (principal surface)
114 . . . Conductive path
120 . . . Optical module (connecting portion)
130 . . . Optical fiber
140 . . . Optical connector (connector)
150 . . . Input/output terminal

What is claimed is:

1. A device handling apparatus that handles a device under test (DUT), the DUT including a main body portion including a die, an optical fiber having one end connected to the main body portion, and a connector connected to the other end of the optical fiber, the device handling apparatus comprising:

a holding head that holds the DUT while the optical fiber is separated from the holding head; and a moving device that moves the holding head, wherein the holding head includes:

a first holding portion that holds the main body portion; and a second holding portion that holds the connector.

2. The device handling apparatus according to claim 1, wherein the first holding portion includes a first suction pad that suctions the main body portion, and the second holding portion includes a second suction pad that suctions the connector.

3. The device handling apparatus according to claim 1, wherein the first holding portion includes a first gripper that grips the main body portion, and the second holding portion includes a second gripper that grips the connector.

4. The device handling apparatus according to claim 1, wherein the moving device presses the DUT, opposed to the holding head, against a socket such that:

a terminal in the main body portion is electrically connected to a contactor of the socket, and a contact portion of the holding head contacts the main body portion.

5. The device handling apparatus according to claim 4, wherein the main body portion includes a wiring board to which the optical fiber is connected and on which the die is mounted, and the contact portion contacts the wiring board when the moving device presses the DUT against the socket.

6. The device handling apparatus according to claim 5, wherein the wiring board includes a connecting portion, to which the optical fiber is connected, on a principal surface of the wiring board, and the contact portion contacts a region other than the connecting portion on the principal surface when the moving device presses the DUT against the socket.

7. The device handling apparatus according to claim 5, wherein the wiring board includes a connecting portion to which the optical fiber is connected, and the contact portion has a depressed portion that is opposed to the connecting portion when the moving device presses the DUT against the socket.

8. A device testing apparatus that tests the DUT, the device testing apparatus comprising:

the device handling apparatus according to claim 1;

a socket that is electrically connected to the main body portion;

an additional connector that is optically connected to the connector; and a tester that tests the DUT via the socket and the additional connector.

9. The device testing apparatus according to claim 8, further comprising:

an additional moving device that moves the additional connector in a direction substantially parallel to a principal surface of the main body portion, wherein the socket includes an additional contact portion that contacts the connector in the direction.

* * * * *